United States Patent
Parker et al.

(10) Patent No.: US 10,134,521 B1
(45) Date of Patent: Nov. 20, 2018

(54) RF TRANSMITTER AND METHOD OF MANUFACTURE THEREOF

(71) Applicant: BAE Systems plc, London (GB)

(72) Inventors: Michael James Parker, Chelmsford (GB); Ian Anthony Moore, Chelmsford (GB); Daniel James Scott, Chelmsford (GB)

(73) Assignee: BAE Systems plc, London (GB)

( * ) Notice: Subject to any disclaimer, the term of this patent is extended or adjusted under 35 U.S.C. 154(b) by 0 days.

(21) Appl. No.: 15/777,736

(22) PCT Filed: Nov. 23, 2016

(86) PCT No.: PCT/GB2016/053638
§ 371 (c)(1),
(2) Date: May 21, 2018

(87) PCT Pub. No.: WO2017/089757
PCT Pub. Date: Jun. 1, 2017

(30) Foreign Application Priority Data

Nov. 25, 2015 (GB) .................................. 1521048.7

(51) Int. Cl.
*H01F 27/32* (2006.01)
*H01F 27/28* (2006.01)
(Continued)

(52) U.S. Cl.
CPC .............. *H01F 27/32* (2013.01); *H01F 27/24* (2013.01); *H01F 27/28* (2013.01); *H01F 27/40* (2013.01);
(Continued)

(58) Field of Classification Search
CPC ..................................................... H01F 27/32
(Continued)

(56) References Cited

U.S. PATENT DOCUMENTS 3,597,705 A * 8/1971 Weiss ...................... G01S 7/282
331/106
4,039,982 A * 8/1977 Weldon ..................... H01P 7/02
331/97

FOREIGN PATENT DOCUMENTS

WO      2015155783 A     10/2015

OTHER PUBLICATIONS

International Preliminary Report on Patentability, dated May 29, 2018, 9 pages.
(Continued)

Primary Examiner — Joseph Chang
(74) Attorney, Agent, or Firm — Maine Cernota & Rardin

(57) ABSTRACT

A radio frequency (RF) transmitter, comprising a Tesla transformer and an LC oscillator, said Tesla transformer comprising inner and outer conductors (10, 20), said inner conductor (20) comprising a generally tubular magnetic core (22) carrying a conductive member (22a) on its outer surface and said outer conductor (10) comprising a generally tubular magnetic core (13) carrying a conductive member (12) on its inner surface, said LC oscillator including a secondary winding module (40) comprising a generally tubular body (41) carrying a conductive coil (42) on its outer surface, said inner conductor (20), outer conductor (10) and secondary winding module (40) being arranged in a substantially concentric nested configuration such that said inner conductor (20) is located within said secondary winding module (40) and said secondary winding module (40) is located within said outer conductor (10), wherein a first portion (45) of relatively high permittivity dielectric material is provided between said conductive member (22a) of said inner conductor (20) and said conductive coil (42) and a second portion (33) of relatively high permittivity dielectric mate-
(Continued)

rial is provided between said conductive coil (42) and said conductive member (12) of said outer conductor (10).

12 Claims, 6 Drawing Sheets

(51) Int. Cl.
*H01F 27/24* (2006.01)
*H04B 1/04* (2006.01)
*H03B 5/08* (2006.01)
*H01F 41/04* (2006.01)
*H01F 27/40* (2006.01)

(52) U.S. Cl.
CPC .............. *H01F 41/04* (2013.01); *H03B 5/08* (2013.01); *H04B 1/04* (2013.01)

(58) Field of Classification Search
USPC .......................................................... 331/97
See application file for complete search history.

(56) References Cited

OTHER PUBLICATIONS

International Search Report and Written Opinion of International Application No. PCT/GB2016/053638, dated 170201, 13 pages.
Gubanov V P et al: "Sources of High-Power Ultrawideband Radiation Pulses with a Single Antenna and a Multielement Array", Instruments and Experimental Techniques, Kluwer Academic Publishers-Plenum Publishers, NE, vol. 48, No. 3, May 1, 2005, pp. 312-320, XP019297117.
Sarkar P et al: "A Compact Batery-Powered Half-Megavolt Transformer System for EMP Generation", IEEE Transactions on Plasma Science, IEEE Service Center, Piscataway, NJ, US, vol. 34, No. 5. Oct. 1, 2006, pp. 1832-1837, XP011321374.
Search Report under Section 17(5) of Great Britain application No. GB1521048.7, dated Mar. 23, 2016, 3 pages.

* cited by examiner

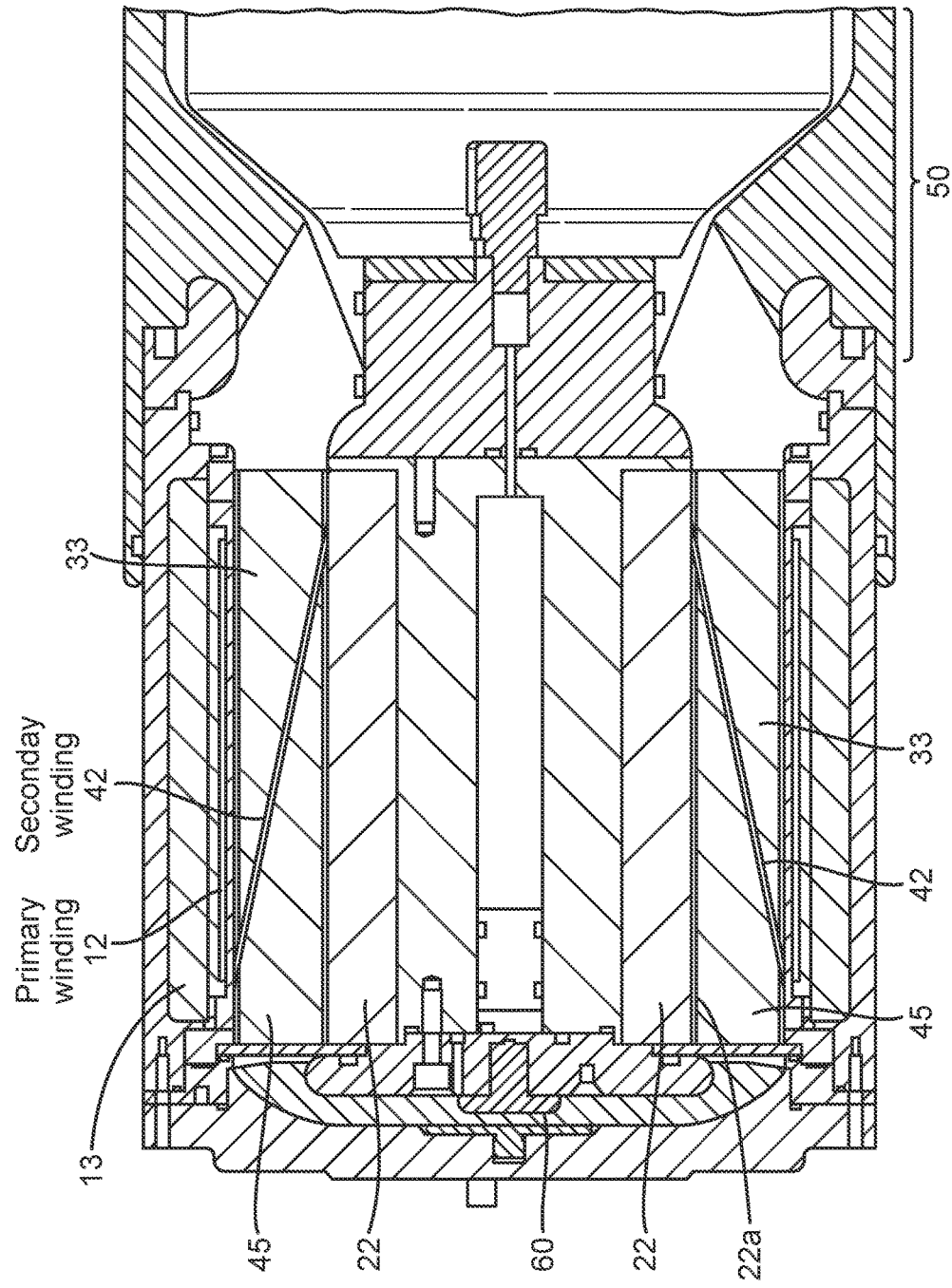

RF TRANSMITTER AND METHOD OF MANUFACTURE THEREOF

RELATED APPLICATIONS

This application is a National Phase application filed under 35 USC § 371 of PCT Application No. PCT/GB2016/053638 with an International filing date of Nov. 23, 2016 which claims priority of GB Patent Application 1521048.7 filed Nov. 25, 2015. Each of these applications are herein incorporated by reference in its entirety for all purposes.

This invention relates generally to an RF transmitter and method of manufacture thereof.

A typical RF transmission system consists of a transmitter and an antenna. The transmitter may be considered to be a closed oscillatory circuit, whereas the antenna is an open oscillatory circuit. Usually, the transmitter and antenna must be connected via a transmission line, which becomes an extension of the closed oscillatory circuit. For maximum energy transfer, the output impedance of the transmitter must match the impedance of the transmission line. An impulse generator, such as a Tesla transformer/storage transmission line may be used as a transmitter. However, the energy and frequency of the radiated output is limited for a given physical size of system. The energy stored, and ultimately radiated, is determined by the capacitance of the transmission line, which exists as part of the Tesla transformer, and the charge voltage provided by the integral Tesla transformer. The frequency of the output is proportional to the length of the transmission line. The output is produced when one end of the transmission line is shorted by a switch. The transmission line may be considered as an infinite series of inductors and capacitor stages—this is known in the art as the 'distributed approach'. If a low frequency output is required, the length of the transmission line becomes prohibitively long.

Such limitations may be obviated by the use of an alternative type of RF oscillator, known as an LC oscillator.

An LC oscillator typically comprises an inductor and capacitor connected in series, with an external generator, such as a Marx generator for example, being used to charge the capacitor. When the charged capacitor is switched into the inductor, an oscillation occurs and this may be radiated by connection of an appropriate antenna. The energy stored by the capacitor is determined by the value of the capacitor and the charge voltage, and the frequency of the resultant radiated signal is dependent on the values of the inductance and capacitance.

This is known in the art as the 'lumped circuit approach'.

There is an ongoing desire to provide an integrated transmitter configuration whereby high energy, relatively low frequency outputs can be achieved, whilst limiting the overall size of the system required.

Aspects of the present invention seek to address at least some of these issues and, in accordance with a first aspect of the present invention, there is provided a radio frequency (RF) transmitter, comprising a Tesla transformer and an LC oscillator, said Tesla transformer comprising inner and outer conductors, said inner conductor comprising a generally tubular magnetic core carrying a conductive member on its outer surface and said outer conductor comprising a generally tubular magnetic core carrying a conductive member on its inner surface, said LC oscillator including a secondary winding module comprising a generally tubular body carrying a conductive coil on its outer surface, said inner conductor, outer conductor and secondary winding module being arranged in a substantially concentric nested configuration such that said inner conductor is located within said secondary winding module and said secondary winding module is located within said outer conductor, wherein a first portion of relatively high permittivity dielectric material is provided between said conductive member of said inner conductor and said conductive coil and a second portion of relatively high permittivity dielectric material is provided between said conductive coil and said conductive member of said outer conductor.

In this configuration, a transmission line formed by the Tesla transformer provides part of the inductance of the oscillator. The relatively high permittivity dielectric material portions to insulate the conductive coil from the conductive members of the inner and outer conductors act as a capacitor element of the oscillator in a 'lumped circuit' approach. Thus, the present invention combines the distributed and lumped circuit approaches described above, whilst having the potential to provide a size reduction for the overall system in excess of 50% for a low frequency output, which might typically be in the region of 50 MHz.

In an exemplary embodiment, the generally tubular body of said secondary winding module has a truncated substantially conical outer profile. Optionally, the inner profile of said generally tubular body of said secondary winding module is substantially cylindrical, so as to define a portion of generally wedge-shaped cross-section between the inner and outer profiles of said secondary winding module. In an exemplary embodiment, said first portion of dielectric material fills or forms said generally wedge-shaped portion. Said first portion of dielectric material may comprise a material or substance of permittivity at least 10, for example of permittivity substantially 10-60. Said first portion of dielectric material may, for example, comprise or include ceramic or ceramic epoxy.

The inner profile of said outer conductor may be substantially cylindrical, and it will thus be appreciated, in this case, that a second, generally wedge-shaped portion will be defined between the outer surface of the conical secondary winding module and the conductive member of the outer conductor, and in an exemplary embodiment of the invention, the second portion of dielectric material substantially fills or forms the second generally wedge-shaped portion. In this case, the RF transmitter may further comprise an insulator module comprising a generally tubular body of relatively high permittivity dielectric material having a tapered inner surface defining a portion of generally wedge-shaped configuration between the inner and outer surfaces of said insulator module, said insulator module being nested substantially concentrically within said outer conductor such that said secondary winding module is located within said insulator module, the first wedge-shaped insulative portion and the wedge-shaped portion defined by said insulator module being arranged in opposing configuration, in use, such that, together, they define an area of generally rectangular cross-section, and wherein said second dielectric portion fills or forms said generally wedge-shaped portion of said insulator module. Again the second portion of dielectric material may comprise a material of permittivity at least 10, for example, of permittivity substantially 10-60. Said second portion of dielectric material may, for example, comprise or include ceramic or ceramic epoxy.

In accordance with another aspect of the present invention, there is provided a method of manufacturing a radio frequency (RF) transmitter, the method comprising the steps of providing an inner conductor comprising a generally tubular magnetic core carrying a conductive member on its outer surface; providing an outer conductor comprising a generally tubular magnetic core carrying a conductive member on its inner surface; providing a secondary winding module comprising a generally tubular body carrying a conductive coil on its outer surface; assembling said inner and outer conductors and said secondary winding module in a substantially concentric nested configuration with said inner conductor located within said secondary winding module and said secondary winding module located within said outer conductor; providing a first portion of relatively high permittivity dielectric material between said conductive member of said inner conductor and said conductive coil; and providing a second portion of relatively high permittivity dielectric material between said conductive coil and said conductive member of said outer conductor.

These and other aspects of the present invention will be apparent from the following specific description in which embodiments of the invention are described by way of examples only, and with reference to the accompanying drawings, in which:

FIG. 3 is a schematic cross-sectional view of a Tesla LC oscillator according to an exemplary embodiment of the present invention;

Figure 1:
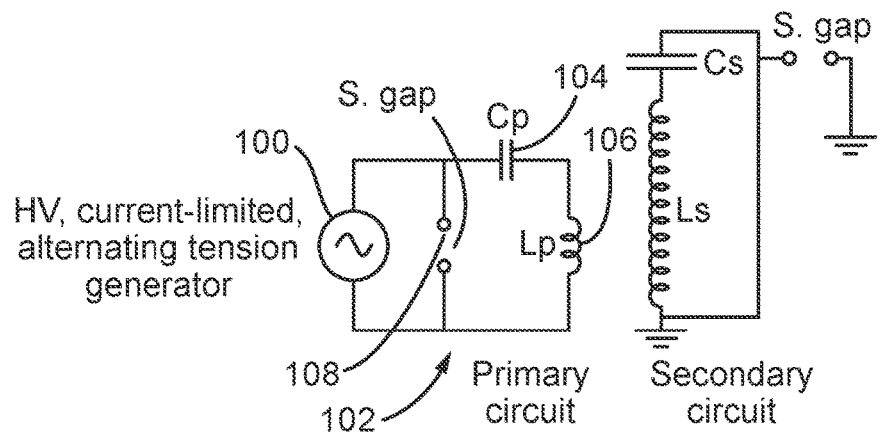
FIG. 1 is a schematic circuit diagram of a Tesla coil according to the prior art.

Referring first to FIG. 1 of the drawings, a typical Tesla coil comprises a generator 100 coupled across a primary circuit 102. The primary circuit comprises a capacitor Cp 104 and inductor Lp 106 connected in series. An open circuit connection defining a spark gap 108 is provided across the generator 100. The Tesla coil further comprises a secondary circuit 110 comprising a second inductor Lg112, capacitively coupled to a load, typically a transmission line (not shown). In use, the capacitor Cp is charged by the generator 100. When it is fully charged, the spark gap fires and therefore closes the primary circuit 102. Current and voltage oscillate at the resonant frequency of the circuit, and the primary and secondary circuits are magnetically coupled, such that oscillations taking place in the primary circuit induce an electromotive force in the secondary circuit. As the energy of the primary is 'dumped' into the secondary, the amplitude of the oscillations in the primary will gradually decrease while those of the secondary will amplify. Such energy transfer is achieved by means of magnetic induction, with the coupling constant k between the two circuits kept low, typically between 0.05 and 0.2, a few oscillations may be required to transfer all of the energy. However, in general, the impedances of the primary and secondary circuits are typically precisely matched, to maximise the voltage in the secondary circuit. Thus, the transfer of energy occurs in a very small number of cycles of the radio frequency, and relatively little is radiated from the energy.

Figure 2:
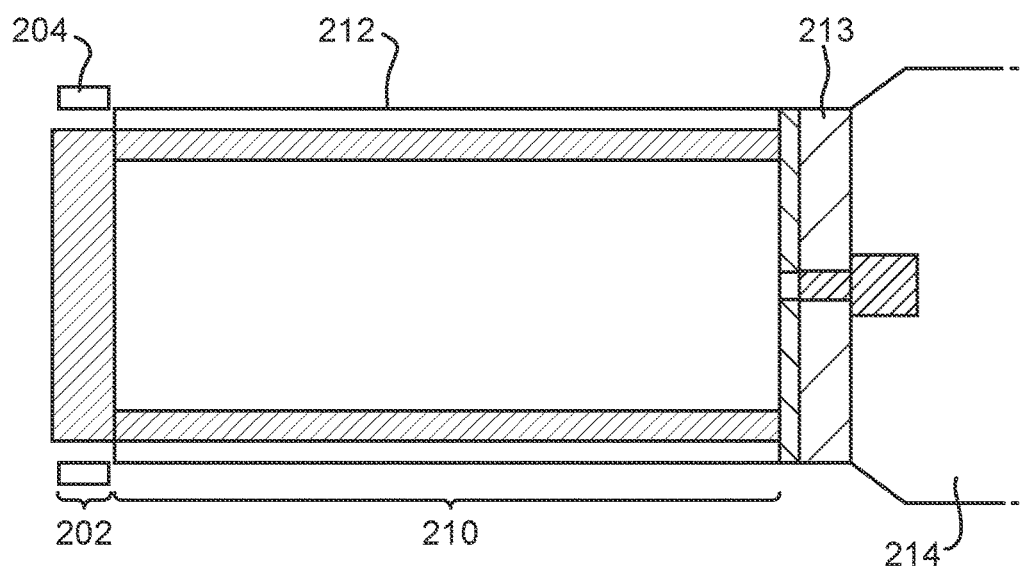
FIG. 2 is a schematic cross-sectional view of a Tesla LC oscillator according to an exemplary embodiment of the prior art.

Referring to FIG. 2 of the drawings, a typical Tesla system is a coaxial structure with evenly distributed electrical stress, comprising a primary coil 204 having a relatively small number of turns, and a secondary coil 212 having a large number of turns. The primary coil 204 and a primary capacitor (not shown) form the primary LC tank circuit 202, and the secondary coil 212 and the output conductor 213 and load (antenna) 214 form the secondary LC tank circuit 210. The primary winding is supplied with a low voltage (hundreds of volts) pulse. The transformer coupling then generates hundreds of kilovolts across the secondary winding and on the output conductor 213. The output conductor 213 rises in volts with the applied primary winding voltage until the switch (spark gap—not shown) operates at the set point, as described above. This causes an excitation of the Tesla assembly and an RF oscillation to be formed on the output conductor 213. This can be used to drive the antenna 214 or other type of system.

In contrast, the present invention proposes a novel configuration of a Tesla system, that enables the provision of a relatively compact device which has much greater energy delivery capability for a given output voltage, and can operate at a lower frequency for its size when compared to a conventional Tesla system. This is achieved in general terms, according to exemplary aspects of the present invention, by using high permittivity and high dielectric strength materials as the principal insulators within the Tesla system. The insulators traditionally used in Tesla systems tend to be plastics, oil or gases, which have good dielectric strength but low permittivity (around 1 to 4). In accordance with exemplary aspects of the present invention, the inventors have developed a Tesla system of novel design and configuration, which uses high permittivity materials of around 10 to around 60 to achieve the above-mentioned advantages.

Figure 4A:
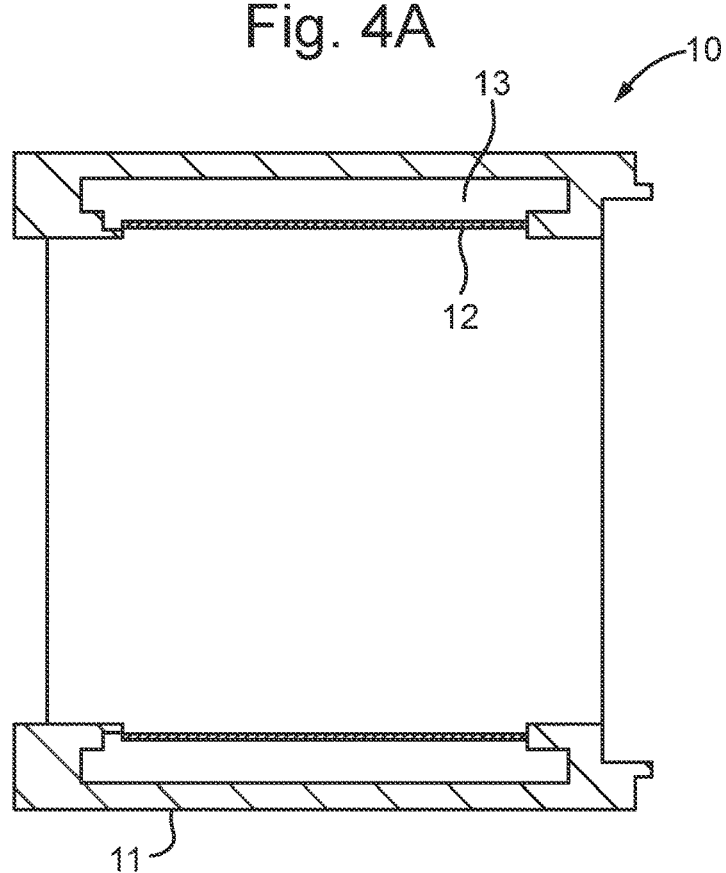
FIGS. 4A and 4B are schematic respective cross-sectional and perspective view of the outer conductor of the system of FIG. 3.
Figure 4B:
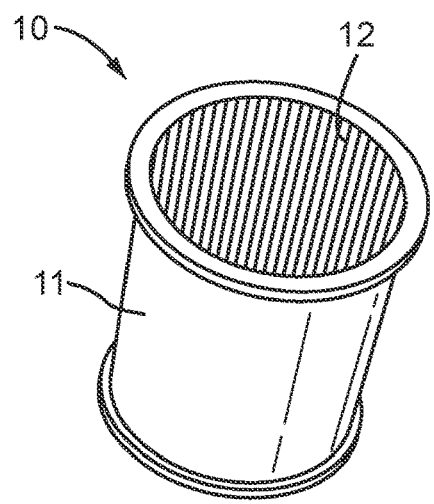

Thus, referring to FIG. 3 of the drawings a Tesla system according to an exemplary embodiment of the present invention comprises an outer conductor 10, an inner conductor 20, an insulating tube 30 and a secondary winding module 40. Referring additionally to FIGS. 4A and 4B of the drawings, the outer conductor 10 comprises a generally tubular body 11 having an internal generally tubular magnetic core member 13 (of, for example, iron) having an inner surface on which a slotted conductor 12 is defined.

The slotted conductor 12 comprises a plurality of elongate conductive strips arranged in side-by-side parallel configuration longitudinally along the length of the magnetic core member 13 and around its inner circumference. The slotted conductor 12 defines the primary winding of the Tesla system.

Figure 5A:
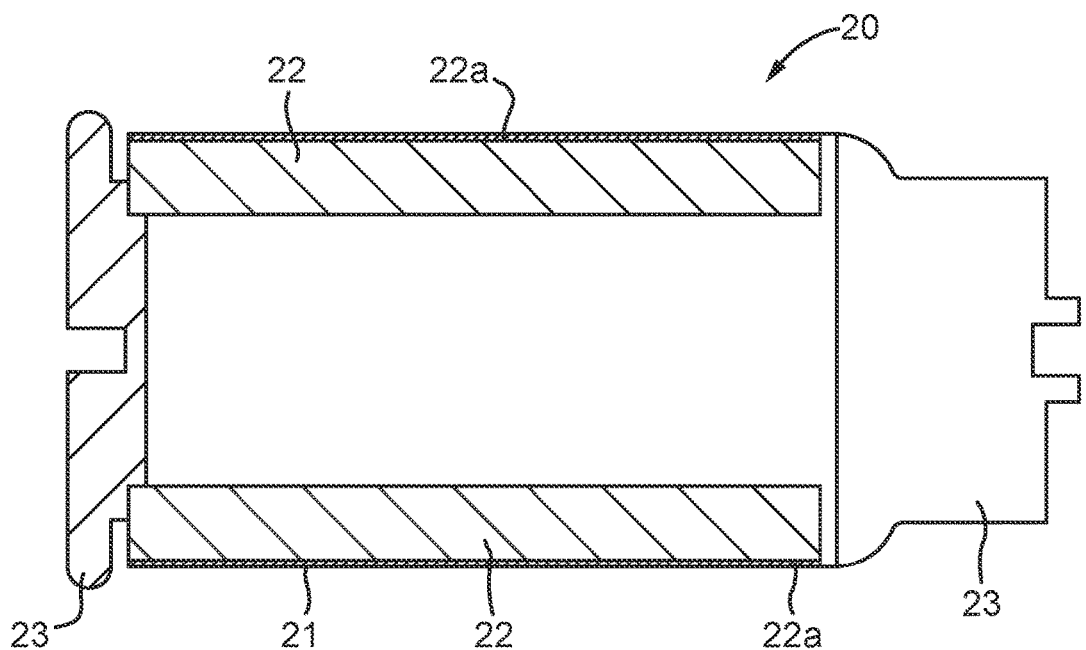
FIGS. 5A and 5B are schematic respective cross-sectional and perspective views of the inner conduction of the system of FIG. 3.
Figure 5B:
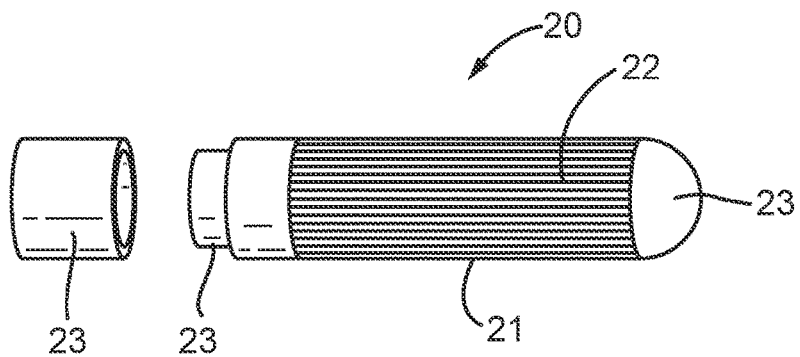

Referring additionally to FIGS. 5A and 5B of the drawings, the inner conductor 20 comprises a generally tubular body 21 of a diameter less than that of the outer conductor 10. In this case, a generally tubular magnetic core 22 defines, or is provided within, the principal length of the tubular body 21 and the outer surface of the magnetic core 22 is provided with a slotted conductor 22a, comprising a plurality of elongate conductive strips (having a relatively low permittivity (e.g. around 1 to around 4), arranged in parallel, side-by-side configuration longitudinally along the length of the magnetic core 22 and around its outer circumference. The strips are connected together at their ends by a conductive ring at respective ends of the tubular body 21. Brass end caps 23 are provided at respective ends of the tubular body 21 to provide conductive coupling members in respect thereof.

Figure 6A:
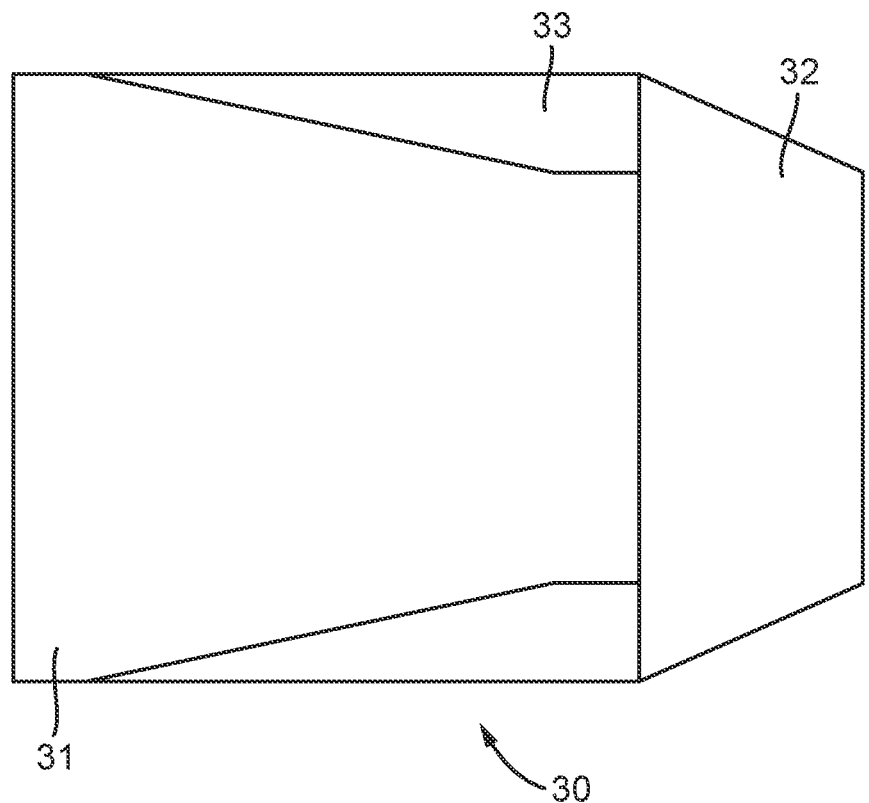
FIGS. 6A and 6B are schematic respective cross-sectional and perspective views of the insulating tube of the system of FIG. 3.
Figure 6B:
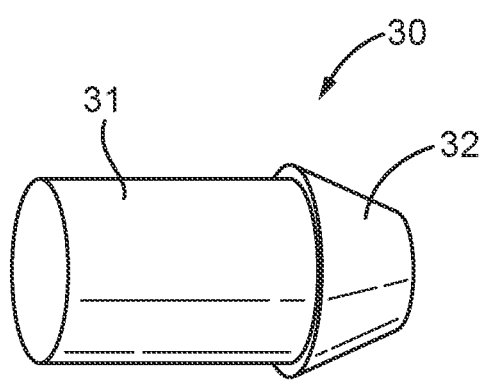

Referring now to FIGS. 6A and 6B of the drawings, the insulating tube 30 comprises a generally tubular body portion 31 including a tapered end portion 32 that tapers, via its outer walls, to a reduced diameter at one end. The inner surface of the body option 31 is provided with an insulating portion 33, which is of maximum thickness close to the end portion 32 and tapers, away from the end portion 32, to a point close to the opposing end of the body portion 31, such that the insulating portion 33 has a generally wedge-like cross-section. It will be appreciated that the insulating portion 33 is formed of a high permittivity (i.e. around 10 or more) material of high dielectric strength, such as a ceramic or ceramic epoxy material. The body portion 31 and end portion 32 of the insulating tube 30 may be integrally framed of the same material.

Figure 7A:
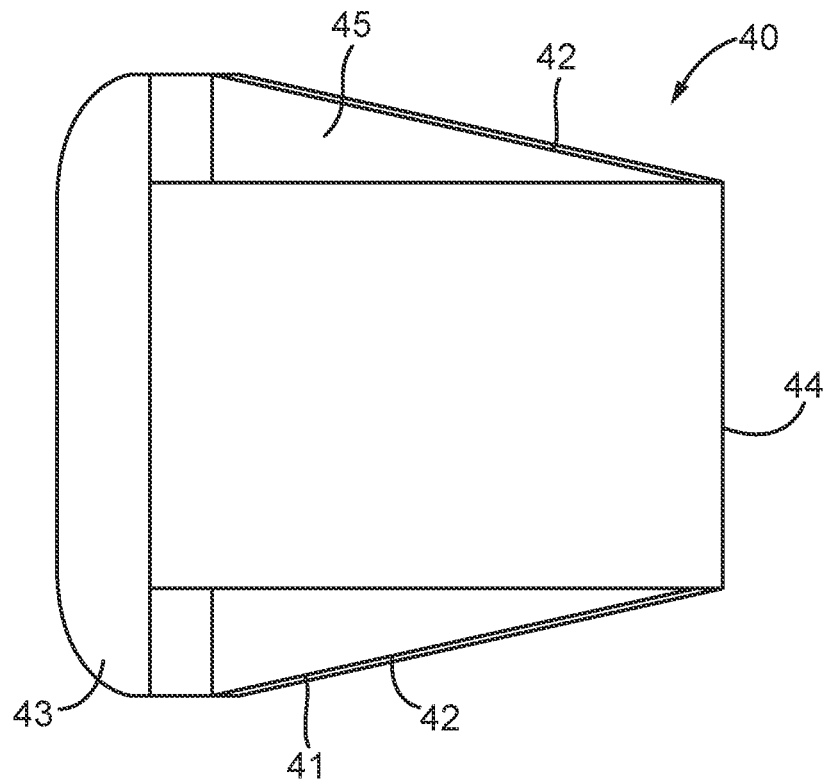
FIGS. 7A and 7B are schematic respective cross-sectional and perspective views of the secondary winding module of the system of FIG. 3.
Figure 7B:
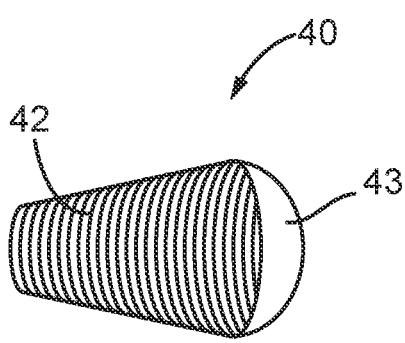

Referring now to FIGS. 7A and 7B of the drawings, the secondary winding module 40 comprises a core 41 of generally truncated conical configuration having a densely wound coil 42 (of relatively low permittivity, e.g. around 1 to around 4) wound along substantially all of its length. The (secondary) coil 42 has a significantly greater number of turns than the primary winding 12 and may also comprise two or more layers of windings, if required. The core 41 has a generally bulbous end portion 43 and is open at the opposing end 44. The bulbous end portion 43, which contributes to the inductance of the LC oscillator, is insulative and may comprise a dielectric filled member, wherein said dielectric may be a gas, plastic or ceramic, for example. However, it will be appreciated that the area defining the switch gap will be gas filled. The inner surface of the conical core 41 is provided with a second insulating portion 45, which is of maximum thickness close to the end portion 43 and tapers uniformly along the length of the core 41 to a point close to the open end 44, such that the second insulating portion 45 has a generally wedge-like cross-section. Once again, the second insulating portion 45 is formed of a relatively high permittivity (i.e. greater than 10) high dielectric strength material, such as ceramic or ceramic epoxy material.

Referring back to FIG. 3 of the drawings, it can be seen that the outer conductor 10, inner conductor 20, insulating tube 30 and secondary winding module 40, fit together in a nested concentric configuration, with the inner conductor 20 closest to the centre and nested within the secondary winding module 40. The secondary winding module 40 is nested within the insulating tube 30, wherein the first and second insulating portions 33, 45 thereof are in opposing orientation so as to fit together, in the assembled configuration, to define a substantially rectangular cross-sectional area with the secondary windings extending diagonally through it. Finally, the secondary winding module 40 is nested within the outer conductor 10.

The high permittivity dielectric (insulating portions 33, 45) utilised within the Tesla section of the device to insulate the secondary winding from the primary winding and from the inner conductor acts as the capacitor element of the oscillator in the 'lumped circuit' approach described above.

The transmission line formed by the Tesla transformer provides part of the inductance of the oscillator, which together with the inductance of the end cap 23a provides the total inductance of LC oscillator. The output is radiated from, for example, an appropriate antenna 50, which is connected to one end of the transmission line, when the line is shorted by a switch (e.g. gas switch 60) mounted within the end cap 23b at the opposite end. The inductance of the switch housing may be adjusted by the geometry of the design in order to achieve the desired output frequency.

In use, the energy stored in the high permittivity insulators (33, 45) is slowly allowed to transfer to the output load (antenna 50). After the switch 60 has operated, the RF wave generated reflects back and forth on the inner conductor 20 until all energy has transferred to the antenna 50. This happens because it has a much lower impedance when compared to the load. If the impedances were matched (as described above with reference to the prior art), the energy would transfer within a few cycles of the RF and very little would be radiated from the antenna. The different impedances allow the transfer of energy in comparatively many cycles of the RF, allowing more energy to be radiated.

The use of high permittivity materials causes additional design issues as the position that it is used in now includes materials of lower permittivity. The mix of high and low permittivity materials in this very high electric stress area increases the electrical stress in the lower permittivity material to, say >100 kV/mm, as opposed to the ~30 kV/mm seen in the insulating portions (33, 45). This is thought to have previously discouraged this design practice. However, through significant innovative effort, the present inventors have devised a novel configuration that allows the use of high permittivity materials in this manner, to achieve the above-mentioned advantages.

Whilst a specific embodiment of the present invention has been described in detail above, it will be appreciated by a person skilled in the art that modifications and variations can be made to the described embodiments without departing from the scope of the present invention as defined by the appended claims. Firstly, it will be appreciated that suitable materials for the insulating portions 33, 45 include any suitable high permittivity (high dielectric strength material) having a permittivity ($\varepsilon_r$) 10 or more and in any event, greater than the permittivity of the conductive materials used within the Tesla system. Such high permittivity materials may comprise or include ceramic or ceramic epoxy materials, but other suitable materials will be known to a person skilled in the art and the present invention is not necessarily intended to be limited in this regard.

It is thought that the high permittivity materials used for the insulating portions (33, 34) may have a permittivity ($\varepsilon_r$) of around 10 to around 60 for optimum results, but again the present invention may not necessarily be limited in this regard.

When designing a compact high power Tesla LC oscillator according to an exemplary embodiment of the invention, several factors need to be considered and carefully optimised to achieve the desired result. Such factors, which may all have an impact on the final performance and operative point of the device, include:

length;
diameters of inner and outer conductors;
frequency of operation;
internal impedance and load (antenna, etc.) impedance;
capacitance;
inductance;
switch inductance and profile;
permittivity;
electrical stress and enhancements due to using mixed permittivity components;
energy;
voltage.

It will be appreciated that a minor change in any of the above-mentioned parameters can have a major influence on the operation of the system.

The invention claimed is:
1. A radio frequency (RF) transmitter, comprising a Tesla transformer and an LC oscillator, said Tesla transformer comprising inner and outer conductors, said inner conductor comprising a generally tubular magnetic core carrying a conductive member on its outer surface and said outer conductor comprising a generally tubular magnetic core carrying a conductive member on its inner surface, said LC oscillator including a secondary winding module comprising a generally tubular body carrying a conductive coil on its outer surface, said inner conductor, outer conductor and secondary winding module being arranged in a substantially concentric nested configuration such that said inner conductor is located within said secondary winding module and said secondary winding module is located within said outer conductor, wherein a first portion of dielectric material comprising a material or substance of permittivity at least 10 is provided between said conductive member of said inner conductor and said conductive coil and a second portion of dielectric material is provided between said conductive coil and said conductive member of said outer conductor.

2. The transmitter according to claim 1, wherein the generally tubular body of said secondary winding module has a truncated substantially conical outer profile.

3. The transmitter according to claim 2, wherein the inner profile of said generally tubular body of said secondary winding module is substantially cylindrical, so as to define a region of generally wedge-shaped cross-section between the inner and outer profiles of said secondary winding module.

4. The transmitter according to claim 3, wherein the first portion of dielectric material fills or forms said generally wedge-shaped region.

5. The transmitter according to claim 1, wherein said first portion of dielectric material comprises a material or substance of permittivity substantially 10-60.

6. The transmitter according to claim 5, wherein said first portion of dielectric material comprises or includes ceramic or ceramic epoxy.

7. The transmitter according to claim 2, wherein the inner profile of said outer conductor is substantially cylindrical such that a second, generally wedge-shaped region is defined between the outer surface of the conical secondary winding module and the conductive member of the outer conductor.

8. The transmitter according to claim 7, wherein the second portion of dielectric material substantially fills or forms the second generally wedge-shaped region.

9. The transmitter according to claim 8, further comprising an insulator module comprising a generally tubular body of dielectric material having a tapered inner surface defining a portion of generally wedge-shaped configuration between the inner and outer surfaces of said insulator module, said insulator module being nested substantially concentrically within said outer conductor such that said secondary winding module is located within said insulator module, the first wedge-shaped dielectric portion and the wedge-shaped region defined by said insulator module being arranged in opposing configuration, in use, such that, together, they define a region of generally rectangular cross-section, and wherein said second dielectric portion fills or forms said generally wedge-shaped region of said insulator module.

10. The transmitter according to claim 1, wherein the second portion of dielectric material comprises a material of permittivity at least 10, for example, of permittivity substantially 10-60.

11. The transmitter according to claim 10, wherein said second portion of dielectric material comprises or includes ceramic or ceramic epoxy.

12. A method of manufacturing a radio frequency (RF) transmitter, the method comprising the steps of providing an inner conductor comprising a generally tubular magnetic core carrying a conductive member on its outer surface; providing an outer conductor comprising a generally tubular magnetic core carrying a conductive member on its inner surface; providing a secondary winding module comprising a generally tubular body carrying a conductive coil on its outer surface; assembling said inner and outer conductors and said secondary winding module in a substantially concentric nested configuration with said inner conductor located within said secondary winding module and said secondary winding module located within said outer conductor; providing a first portion of dielectric material comprising a material or substance of permittivity at least 10 between said conductive member of said inner conductor and said conductive coil; and providing a second portion of dielectric material between said conductive coil and said conductive member of said outer conductor.

* * * * *